United States Patent [19]

DeRobertis et al.

[11] 4,395,165
[45] Jul. 26, 1983

[54] CHIP SHUTTLE TRACK

[75] Inventors: Ignatius J. DeRobertis, Poughquag; Javathu K. Hassan, Hopewell Junction; Robert L. Judge, Poughkeepsie; John A. Paivanas, Hyde Park, all of N.Y.

[73] Assignee: International Business Machine Corp., Armonk, N.Y.

[21] Appl. No.: 218,232

[22] Filed: Dec. 19, 1980

[51] Int. Cl.³ .............................................. B65G 51/02
[52] U.S. Cl. ..................................................... 406/88
[58] Field of Search ...................... 406/10, 88, 72, 73; 294/64 R

[56] References Cited

U.S. PATENT DOCUMENTS

| | | | |
|---|---|---|---|
| 2,805,898 | 9/1957 | Willis | 406/88 |
| 3,180,688 | 4/1965 | Futer | 406/88 |
| 3,350,140 | 10/1967 | Sprydom | 406/88 |
| 3,614,168 | 10/1971 | Range | 406/88 X |
| 3,976,330 | 8/1976 | Babinski et al. | 406/88 |
| 4,050,729 | 9/1977 | Hupson | 294/64 R |
| 4,081,201 | 3/1978 | Hassan et al. | 406/88 |
| 4,165,132 | 8/1979 | Hassan et al. | 406/10 |

FOREIGN PATENT DOCUMENTS 1288686   9/1972   United Kingdom ................. 406/88

OTHER PUBLICATIONS

IBM Journal-Air Film System for Handling Semiconductor Waters-Parvanas 1979.
IBM Technical Disclosure-Self-Centering Air Lift Transport-Apgar et al. 12/1975.

*Primary Examiner*—John J. Love
*Assistant Examiner*—Gene A. Church
*Attorney, Agent, or Firm*—Henry Powers; John F. Ohlandt; J. Jancin, Jr.

[57] ABSTRACT

A transport system is disclosed, including an air film shuttle conveyor for conveying semiconductor chips from a loading to an unloading station, the conveyor comprising a base plate and upstanding side guide walls extending longitudinally of the base plate, the guide walls being spaced apart a distance slightly greater than the lateral dimension of said chips; further included are means providing a laminar air flow which surrounds the chips and forms an air film supporting them and propelling them downstream such that the slight spacing between the chips and the guide walls causes the flow resistance to be higher in the one region defined by said slight spacing than in the region defined by the spacing between the chips, whereby a continuous and flexible separation action occurs between the chips.

8 Claims, 13 Drawing Figures

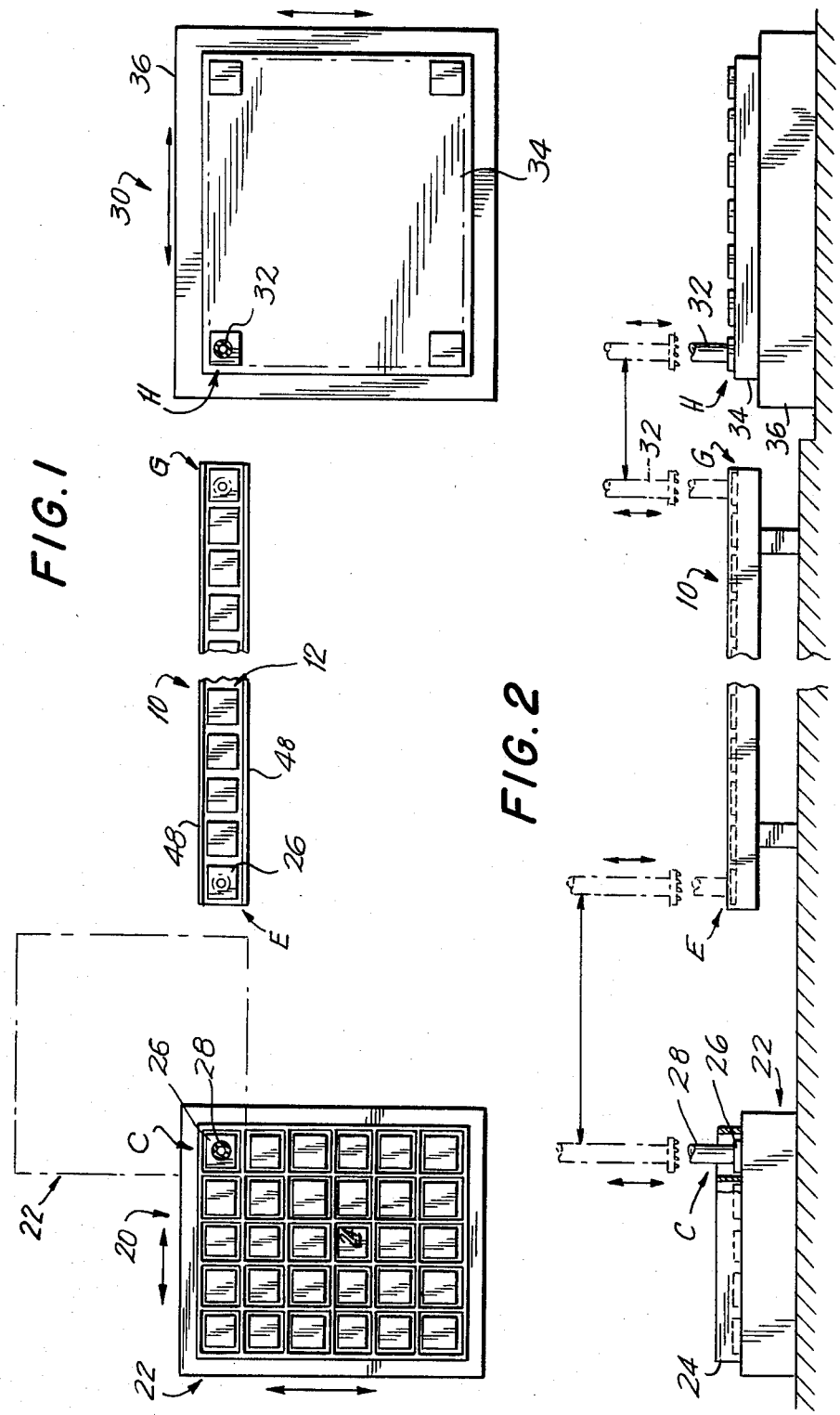

FIG. 9
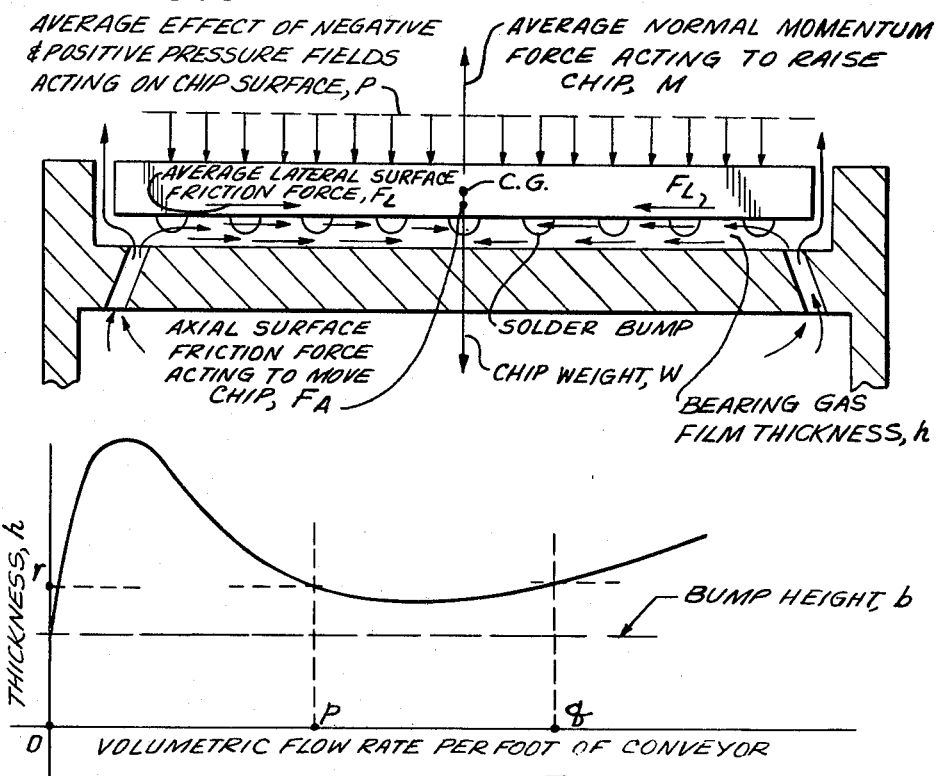
FIG. 13
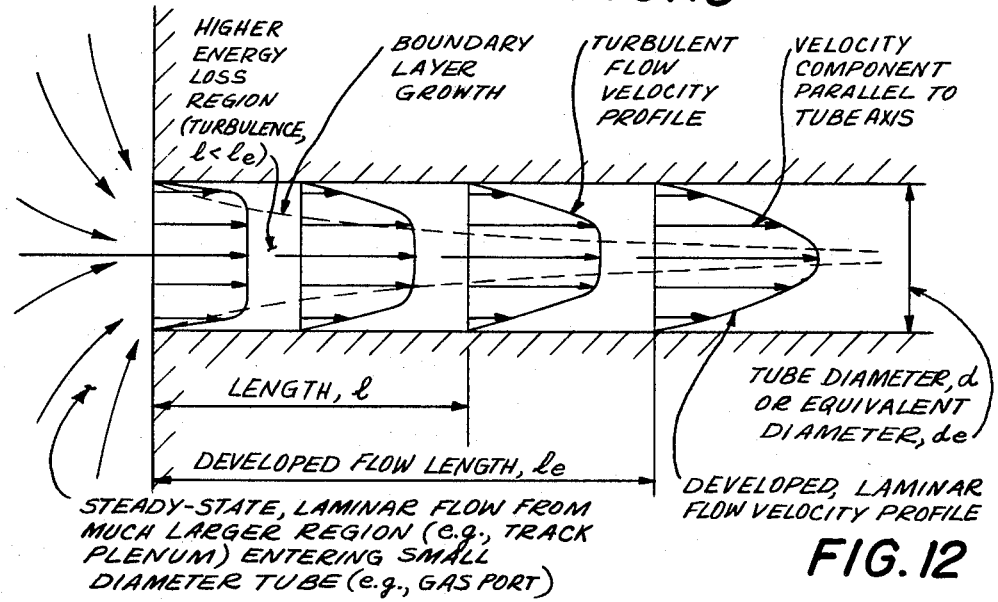
FIG. 12

CHIP SHUTTLE TRACK

BACKGROUND OF THE INVENTION

1. Field of the Invention

This invention relates to semiconductor device fabrication, and more particularly, to the processing of so called chips of fragile semiconductor material in which complex densely packed circuits are embedded.

At the end of the processing line for semiconductor chips, it has become more or less standard practice to mount or position the chips on ceramic substrates or the like. However, in order to do so efficiently it becomes necessary to provide a suitable automated technique for moving or conveying the light-weight chips from their final stages of processing to a suitable loading point, thence to transport them quickly and efficiently to the mounting or packaging area.

What has been done conventionally in achieving the required rapid transport is to use a vibratory technique to induce movement of the chips. However, such vibratory transport method and like methods necessarily involve chip contact with the attendant possibilities of damage to the chips; hence, an ultimate decrease in yield of product.

As semiconductor or integrated circuit technologies continue to develop, with concentration on ever higher density circuits, this factor of damage to chips will become consequential. This is particularly so in the case of very large scale integrated circuit technologies which place great emphasis on improvement of overall yields. Necessarily in that case, it becomes an increasingly important goal to reduce manufacturing induced defects such as the aforenoted chip damage resulting from the conventional techniques adopted for transporting such chips.

Accordingly, the primary object of the present invention is to provide a means and technique for handling semiconductor chips very efficiently throughout the steps of the packaging phase of processing such that a minimum amount of contact between finished chips is involved in their automated transport.

Since one of the commonly produced integrated circuit chips includes in its finished state a group or plurality of contact pads, it is important that a system for handling such light-weight chips be capable of transporting them efficiently despite the unusual contour involved.

Accordingly, it is a more specific object of the present invention to provide a transport system that will efficiently convey such articles and provide such appropriate spacing between them that the aforenoted object of aluminum contact is fulfilled.

2. Background Art

For general teaching with respect to the conveying of slab shaped articles, reference may be made to U.S. Pat. No. 350,140. Further background material is provided by reference made in that patent to U.S. Pat. Nos. 2,805,898 and 3,180,688.

The basic object of the invention in U.S. Pat. No. 3,350,140 is to provide a system in which air consumption is reduced and the centralizing of articles in a conveying trough is achieved. To accomplish its objects, jets are provided in two rows parallel to the respective side walls and the jets in each row are inclined towards the other row at an angle causing amplification of the cushioned pressure. The system of that same patent also provides propulsion jets located along the center line of the trough.

Whatever merits the system of U.S. Pat. No. 3,350,140 possesses, it deals with the transport of articles much heavier than semiconductor chips, and which have a smooth underside; that is to say, there are no protrusions, mounds or other unusual contours that offer difficulty in the transport of the articles by the embodied technique.

As further background for the present invention, reference may be made to patents and articles which relate to transport systems for semiconductor wafers. Such systems for example are described in U.S. Pat. No. 4,081,201; U.S. Pat. No. 4,165,132; U.S. Pat. No. 3,976,330; IBM Technical Disclosure Bulletin Vol. 18, No. 7, December 1975 entitled "Self Centering Airlift Transport" by D. H. Apgar and T. C. Ku; and in IBM Journal of Research and Development, Vol. 23, July 1979 entitled "Air Film System for Handling Semiconductor Wafers" by J. A. Paivanas and J. K. Hassan. Another generalized device or system for supporting or conveying materials may be appreciated by reference to U.S. Pat. No. 2,678,237. Yet another systems that provide background for the present invention are those disclosed in U.S. Pat. No. 2,805,898 and U.S. Pat. No. 3,614,168.

Airtrack conveying systems such as that disclosed in the previously cited U.S. Pat. No. 3,976,330 are concerned principally with the need for self-centering in the conveying operation; however, they are not focused on problems connected with the transport of rectangular or prismatic parts, such as chips, which, particularly in the case of the provision of contact pads, have the further problem of an irregular surface due to the presence of solder mounds or the like. Moreover, the matter of obtaining spacing between parts is not a major objective in wafer conveyors and in fact, is not automatically achieved by differential air pressure, as is the case with the present invention. Also, systems for wafer transport, as contrasted with chip transport, often require special start controls, rather than the control being solely a function of track design and the shape of the transported part.

SUMMARY OF THE INVENTION

Viewed in its broadest aspects, the present invention fulfills the previously stated objects by a unique transport system for transporting already processed semiconductor chips from a loading station to an output station at which the chips will be mounted on a conventional ceramic substrate so as to form a module for use in a complex electrical assembly. The chips are transferred from a magazine containing the processed chips, which is situated at the loading station, to a shuttle conveyor, at whose other end they are again transferred by a similar pickup means to the ceramic substrates in a predetermined manner or order.

A primary feature within the system is the air track shuttle conveyor which accomplishes the transport of the chips in a highly stable manner without contact with each other, and with mitigated contact effects with lateral bounding guides, that is to say, the side walls forming part of the conveyor. The separation produced between chips, which thereby avoids damage from contact between them, is due to the provision of means for achieving laminar airflow of particular characteristics between the chips and the plate of the conveyor, which flow is based in part upon the fact of the relatively higher flow resistance encountered as a consequence of the slight spacing between the chips and the side walls. Moreover, it turns out that, given the configuration of the solder mounds on the confronting surface of the chips, the predominant fluid forces associated with the flow in the first regions between the chips and the guide surfaces and the second regions between the chips aid in achieving the desired separation between the chips.

In accordance with further specific features of the present invention the gas feed means is especially designed to aid in achieving the needed separation between chips. Thus the fine gas streams issuing from the bores or grooves of a prescribed ratio of length to equivalent diameter, that is, l/de ratio, impinge suitably against the confronting chip surface which contains the attached array of solder mounds. It has been found that the sensitivity of this flow action is dependent on the l/de ratio of the gas grooves or bores; that is to say, that the ratio must be considerably greater than one in order to maximize this effect. This flow phenomenon will be fully described in later parts of the specification.

Yet another aspect or feature of the invention resides in the provision for efficiently attaining or achieving the required propulsion of the chips in conjunction with the required support and lateral flow movement. Thus, two rows of jets are so arranged that they are directed inwardly toward each other and also forwardly with respect to the desired longitudinal movement for the chips. Effectively then, the two rows of centering jets accomplish what is conventionally provided by having an additional row of longitudinally propelling jets.

BRIEF DESCRIPTION OF THE DRAWING

FIG. 1 is a top plan view of a complete semiconductor chip handling and transport system.

FIG. 2 is an elevation view of the same system.

FIG. 9 is a force diagram illustrating the forces acting on a chip in the air film tracks.

FIG. 12 illustrates certain aspects of a steady state, laminar flow behavior in the entrance region of a small tube such as a gas feed port.

FIG. 13 is a graph depicting the relationship between air film thickness and volumetric flow rate per foot of conveyor.

DESCRIPTION OF PREFERRED EMBODIMENT

Figure 3:
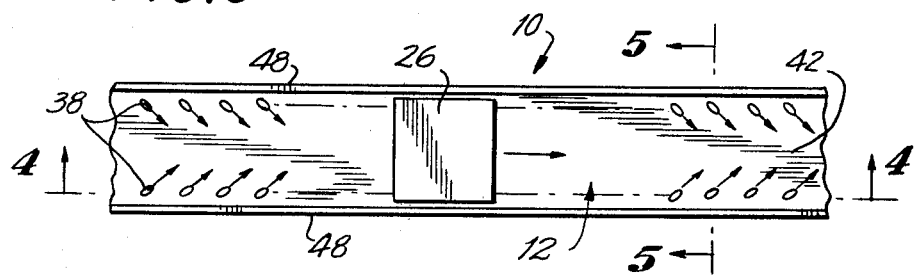
FIG. 3 is a top plan view of the chip conveyor, in fragmentary form; and particularly illustrating details of the jet flow.

Referring now particularly to FIGS. 1 and 2, there will be seen the system of the present invention for handling and transporting semiconductor chips at the final stages, that is, the packaging stages of their processing. An air film shuttle conveyor 10, having a track 12, is seen interposed between a loading or input station 20 and an output or unloading station 30. Seen in phantom outline, and also in solid line, is a movable table 22 on which a magazine 24 is disposed. The magazine 24 holds a number of devices or chips 26 which are to be further processed, that is, to be packaged as modules.

The table 22 is suitably indexed to the position designated C which is under a pickup probe 28 located above position C. The probe 28 is a vacuum probe or pencil of conventional design which is operative to pick up a chip 26 and to move it to track input position E. The chip is then deposited on the conveyor by release of vacuum and the air film or air track 12 provided by conveyor 10 moves the chip to position G at the interface with output station 30.

A second vacuum pickup probe 32 located over the position designated G at the end of the conveyor 10 is operative to pick up a chip 26 and move it to position H where the probe is operative to release the chip and place it on the ceramic substrate 34. As seen, the ceramic substrate 34 is likewise mounted on an XY positioning table 36 for indexing of the various chip locations; that is to say, for appropriately moving the different chip locations to the proper position with respect to probe 32.

The above described operation proceeds continuously until the total number of chips are transferred from the magazine 24 to the various locations on the substrate via the transporting shuttle conveyor 10. As will be explained fully hereinafter, the multiple chips moving on the air film or track do not contact each other, due to the separating characteristics of the motive air film.

Referring now to FIGS. 3-6 details of construction of the shuttle conveyor 10 can readily be understood. In particular in FIG. 3, a single chip 26 is seen being moved on the air film; however, as will be appreciated by reference to FIG. 4, a series of chips 26 is conveyed in a typical operation. Thus, for purposes of simplification and to illustrate certain details of construction, only the single chip 26 is seen in FIG. 3.

Figure 5:
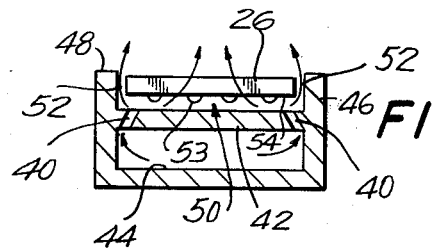
FIG. 5 is a sectional view taken on the line 5—5 in FIG. 3, particularly illustrating the grooves defining the airflow ports.

It will be noted that a plurality of gas jets 38 in two rows are provided, the gas, usually air, being fed through feed ports or bores 40. These ports are so formed that they produce inclined gas jets, that is gas jets in the two rows that are inclined angularly towards each other, as well as being inclined forwardly to assist in propelling the chip 26. The ports 40 are formed through a feed plate 42, for example, by simply drilling holes through plate 42; alternately they can be constituted of matching grooves formed in both the plate 42 and in the corresponding portion of the body structure 46 (FIG. 5). A plenum 44 for providing the pressurized gas is defined by the lower portion of the body structure and by the aforenoted plate 42. The upper portion of the structure 46 defines sidewalls 48. A typical volumetric flow rate, by way of plenum 44, per foot of conveyor would be selected in the range of 0.0005 to 0.015 (standard) cubic feet per second.

As will be especially appreciated by reference to FIG. 5, a bearing gas film 50 is developed from the flow through the ports 40 at the underside of the chips, and a lateral surface gas film 52 is likewise developed. As will also be appreciated by comparing FIGS. 4 and 5 there is extremely slight spacing between the longitudinal edges of a given chip 26 and the sidewalls 48 of the conveyor.

The slight spacing between the longitudinal edges of the chip 26 and the sidewalls 1 in a typical practical implementation, is of the order of 0.010 inches, the chips themselves being about 0.18 square inches in surface area. The chip separation obtained, designated 55 in FIG. 4, in such practical implementation is approximately 0.070 inches. As will be made especially clear, the presence of solder mounds 53 on the lower surface 54 which confronts the gas stream is signifcant in the dynamic fluid flow involved.

Figure 6:
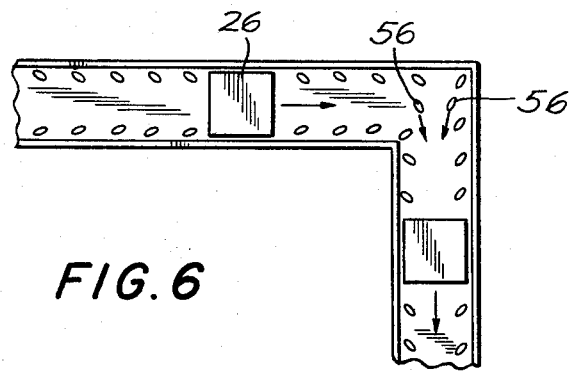
FIG. 6 as a top plan view illustrating a modified configuration so as to provide a turn in the air film shuttle conveyor.

Reference to FIG. 6 will make clear that other functional requirements, such as a turn junction in the conveyor, can be implemented. In order to provide that the chips can change direction, impulse jets 56 can be incorporated as seen in that figure. Similar changes, such as those needed to move chips up or down an incline, can be made.

Figure 4:
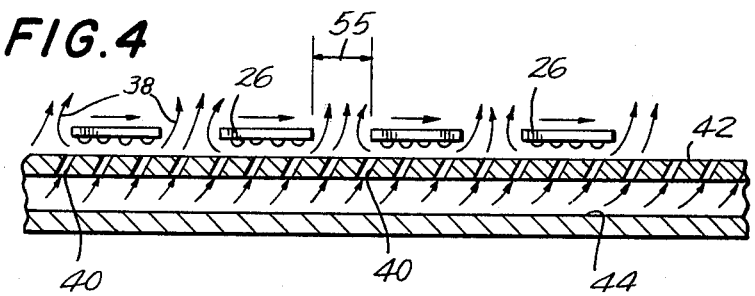
FIG. 4 is a cross sectional view taken on the line 4—4 in FIG. 3.

Basically, the fluid mechanics aspects of the present invention pertain to the coupled effects of the gas feed port or groove design and the irregular texture of the chip surface in contact with the gas film. Referring to FIGS. 3-5, the fine gas streams issuing from the grooves of a given length-to-equivalent diameter ratio $1/d_e$, impinge against the chip surface 54 containing an array of attached C4 solder balls 53. For reasons that will be given below, the resulting gas film in providing both support and motion to a chip, also exerts a pronounced control of the chip motion in a vertical direction. This latter action derives from intrinsic gas flow phenomenon initiated at the "interrupted" chip surface containing flat surface regions between the solder "bumps". The sensitivity of this flow action is, among other aspects, dependent on the $1/d_e$ ratio of the gas grooves, viz., this ratio must be considerably greater than one in order to maximize this effect. From an overall viewpoint, this flow behavior exerts a stabilizing effect to the motion of the chip on the gas film. Considering its small size and low weight, i.e., about 0.18 inches square and 0.014 grams, the chip motion is thus uniquely controlled by this flow action. This characteristic, coupled with the gas film 52 at the track consisting walls 48, provides effective control of chip motion under generally mitigated contact conditions.

FLOW PHENOMENON AT THE CHIP SURFACE

With reference to FIGS. 3-4, the issuing, inclined gas jets 38 impinge against the chip surface and thus exert vertical momentum forces that act to raise the chip above the track surface. At the same time, the flow spreads laterally in the direction of the chip and track surfaces in the process of generating the supporting, motive air film. Along the chip surface, the flow encounters boundary-layer friction as well as the effect of the numerous solder bumps. Motion is imparted to the chip by the resultant impulse effect of the boundary-layer induced friction forces. Concurrently the surface flow in encountering the solder bumps is forced to separate and subsequently coalesce at some distance downstream from each bump.

This separation or "wake" region behind each bump characteristically exhibits a generated low pressure effect which, on an average, is somewhat lower than atmospheric pressure. The extent of the separation region, and hence the low pressure effect, varies with distance of the bump from the impinging locations of the gas jets. Thus, with reference to the track symmetry axis, the low pressure effect is greatest for the outermost chip bumps and decreases with distance of the bumps from the track axis. The integrated pressure effect acting on the chip, reflecting the aggregate influence of positive pressures and the wake pressure regions of the bumps, consists of a resultant force that counteracts to an extent the above momentum repelling forces. This behavior, in turn, results in a constrained vertical motion of the low weight chip on a gas film thickness reflecting the relative effect of the acting forces. Without the constraining effect, the motion of the chip would be highly unstable even at very low flow rates.

Figure 7:
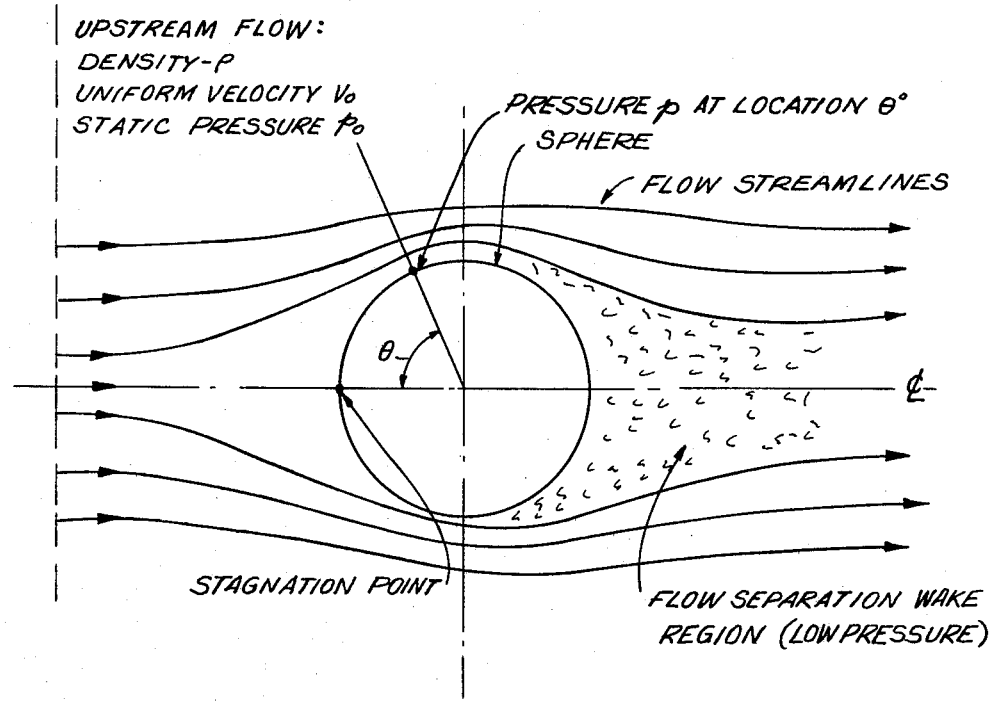
FIG. 7 and FIG. 8 are illustrations of the wake region formation for laminar flow around a sphere.
Figure 8:
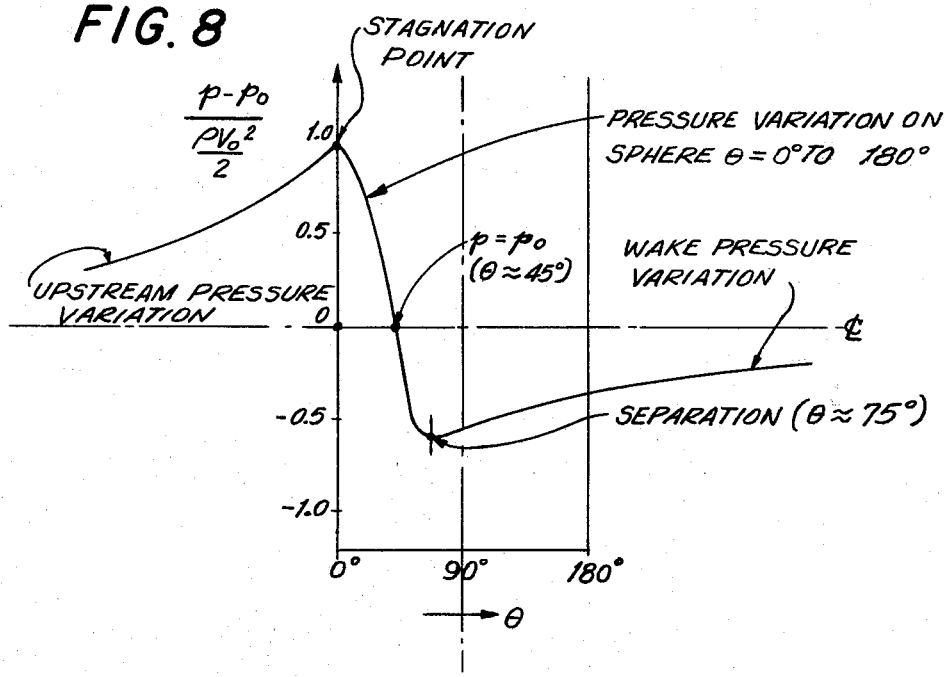

The above phenomenon is described further by first referring to FIG. 7 and FIG. 8 which illustrate some basic characteristics of laminar flow around a sphere. It is axiomatic in fluid mechanics that a flow encountering a solid object will exhibit a maximum pressure at the leading or stagnation region of the object surface. As the flow progresses around the object its velocity continuously changes and therefore the pressure also changes. Because of boundary layer friction, the accelerating flow reaches a location where it is no longer able to follow the curvature of the surface and thus separates from it. A wake region forms behind the object which is characterized by an extent of low pressure owing to this separation action. In the illustrated case of a sphere the flow stagnation occurs at the points where the pressure p is a maximum. The symbols $\rho$, $p_o$, and $v_o$ denote the flow density, upstream pressure and velocity, respectively, and the pressure distribution around the sphere is expressed in dimensionless form as shown in the figure. Thus, at the stagnation pressure $p=p_o+\rho v_o^2/2$. For $\theta>0°$ the pressure p decreases rapidly and at $\theta \approx 45°$ it is equal to $p_o$. For $\theta>45°$, the pressure decreases further and becomes a minimum at $\theta \approx 75°$ which is the flow separation location. Thereafter, the low pressure level persists for a considerable distance in the wake region as illustrated. In the case of turbulent flow the above described characteristics change in that separation occurs much further downstream along the surface, viz., at $\theta \approx 140°$. However, an appreciable low pressure region still exists for this case due to the higher flow acceleration effects associated with the delayed flow separation. In the present case, the flow is essentially laminar so that the pressure distribution around the solder bumps is of the general qualitative character shown in FIG. 8.

Figure 10:
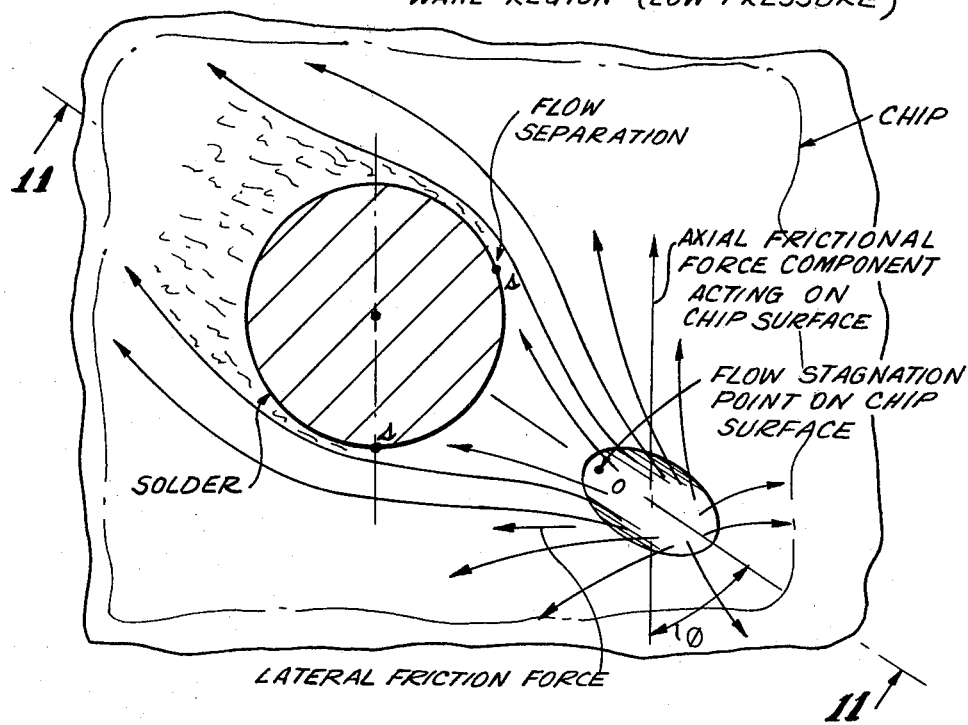
FIG. 10 and FIG. 11 illustrate the flow characteristics of a chip surface.
Figure 11:
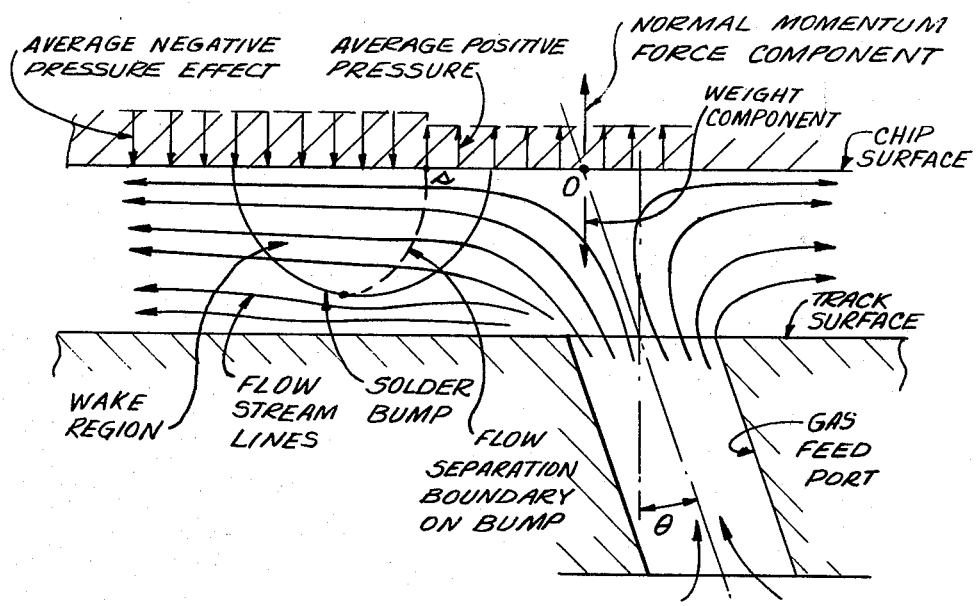

The operation of the above phenomenon in the present case is described with reference to FIG. 9 which shows the chip surface containing essentially hemispherically shaped solder bumps. The gas flow from the track ports, impinging against and moving along the chip surface, encounter the bumps and a multitude of wake regions of varying magnitude are created. The characteristics of the flow in a bump region are illustrated in FIGS. 10 and 11. As seen, the flow impinging against the chip surface proceeds parallel to this and the track surfaces, in a generally radial direction from the surface stagnation point 0. Upon encountering the pump a part of the flow continues under its lower extremity while the bulk of the flow impacts and passes around the bump resulting in the wake region. In many respects, the depicted flow is considerably more complex than that for a sphere in a free flow field as shown in FIG. 7. Basically, we have here a hemisphere in a narrow flow passage bounded by two parallel surfaces. The frictional effects of the surfaces cause a distortion of the pressure field in the overall bump region. The flow behavior thus exhibits an asymmetric nature in that the stagnation point on the bump occurs at some distance below the bump-chip surface junction. Consequently, an asymmetric flow separation boundary is formed as indicated in the figure. This behavior, in conjunction with the coupled influence of the pressure field in the passage, results in a more intensive low pressure field in the wake region. In the neighborhood of each bump, a positive and negative pressure field exists and, as noted earlier, these effects are most pronounced for the outermost bumps and decrease for bumps closer to the track axis. This diminution of these effects is essentially due to the flow field cross-interferences presented by the numerous bumps which, in turn, is coupled to the bump distance from the gas feed ports (i.e., from the chip surface stagnation point 0).

As indicated in FIG. 10, the elemental forces operative in the bump-chip surface region consist of: the momentum, surface friction, and weight components along with the net force effect due to the positive and negative pressure regimes. As noted above, these force effects vary with location along the chip surface and, on an average, a force picture is produced as shown in FIG. 9. Here, M denotes the momentum repelling force acting at the chip center of gravity, which is counteracted in effect by the chip weight W and pressure force P. Thus, the chip moves on the gas film of a thickness, h, determined by the equilibrium condition of these forces, viz., $M = P + W$. Because of the inclination of the gas ports (angles $\theta$ and $\phi$), the resultant surface friction force has lateral and axial components $F_L$ and $F_A$. Due to track symmetry, the opposing $F_L$ forces cancel each other out while the force $F_A$ (seen as a dot in FIG. 9) imparts motion to the chip. In general, the above-described behavior is dependent on supply flow rate; pressure and in particular on the $l/d$ ratio of the gas ports (or, $l/d_e$ ratio in the case of non-circular ports). As noted earlier, this ratio must be considerably greater than one for better performance and will be described further below.

In general, the above flow phenomenon as illustrated in FIG. 7 has been extensively studied both analytically and experimentally (e.g., as described in the book, BOUNDARY-LAYER THEORY by H. Schlichting). For free, parallel flow over surfaces containing bumps, the behavior is considerably more complex and has been the subject of various aerodynamics and other research studies over the years. An example of a theoretical study of this case is contained in the JOURNAL OF FLUID MECHANICS, Volume 83, Part 1, November 1977, pages 163-176. In essence, the study shows the development of pronounced negative pressure regions—even for very shallow bumps. This is due to the perturbation of the attached, thin boundary-layer by the shallow bumps. In the situation where a second parallel surface is included and the flow enters at an angle to the passage, viz., the present case (FIG. 9), the flow behavior is even more complex. As described above, the negative pressure regions for the small bumps are intrinsically augmented by this flow configuration. Thus, a significant aspect of this invention is the utilization of the bump pressure field characteristics to constrain and thereby provide stable motion to the chip.

LENGTH-TO-DIAMETER RATIO OF THE GAS FEED PORTS

As mentioned before, the sensitivity of the described wake-pressure field action is a function of the above ratio. This aspect is related to the so-called developed or entrance length required for the gas flow in the port to achieve a uniform laminar profile. The general features of this flow behavior are described with reference to FIG. 12. Here, a sharp-edged tube of diameter d is shown into which gas enters in steady flow from a much larger region (i.e., as the flow from the plenum into a gas port). The entering, crowding flow characteristically exhibits a large degree of turbulence which diminishes as the flow continues along the tube. This is due to the progressive thickening of the boundary layer with an eventual coalescence into a stable, laminar flow velocity profile. The tube length required for this coalescence to occur is called the development flow entrance length, le. A quantitative description of this flow behavior has been established analytically and experimentally by researchers (e.g., see the book, BOUNDARY-LAYER THEORY by H. Schlichting). The features sketched in FIG. 12 are based on these analyses which, in addition, have established a quantitative relationship for the length le, as shown in the figure. Thus, for a given diameter d and flow Raynolds number, Re, the developed flow length le can be calculated by:

$$\frac{le}{d} > 0.058 \, Re > 0.058 \left( \frac{Vad\rho}{\mu} \right) \quad \text{(Equation a)}$$

where: $\rho$ = average mass density of the flow
$\mu$ = absolute viscosity
$Va$ = average, steady-state flow velocity in the tube
 = mass flow rate $\div (\pi d^2/4)\rho$
 = $m \div (\pi d^2/4)\rho$ The sensitivity of the flow behavior at the chip surface is strongly coupled to the above ratio. For a given port diameter d, or de (non-circular hole), the length l must be considerably greater than d or de and of a magnitude such that l is greater than le (eq. a). Thus, for $l/d$ of $l/de$ greater than $0.058R_e$ the gas flow enters the chip-track passage in a stable laminar condition. In this condition, the entering flow possesses a more concentrated and directed energy effect and, upon impingment against the chip surface, this effect results in more pronounced wake-pressure characteristics. For ratios less than that indicated by eq. (a), the wake effects are diminished due to the presence of turbulence in the entering flow. Thus, another significant aspect of this invention is the gas port ratio requirement associated with achieving most advantageous wake-pressure characteristics.

It will be appreciated that the air film thickness on which the chip is transported will vary due to the interaction of the coacting fluid repelling and fluid attraction forces. As illustrated in FIG. 13, as the flow rate is increased from zero, the film thickness h will initially increase rapidly due to the dominant effect of momentum repelling forces associated with the air streams impinging against the chip surface. With further increase in flow rate, this behavior is steadily counteracted by the developing attraction force with the result that the film thickness will begin to decrease after passing through a maximum value. Referring to FIG. 11, the force equilibrium relationship at an air film thickness h, is thus given by $M = P + W$. At the low flow rate range, M is greater than P which is reflected by a higher equilibrium value of h. At higher flow rates, h will decrease due to the dominance of P and eventually will again begin to increase due to the increasing influence of M. At some point, far removed from the present practical range, the chip will be repelled from the conveyor surface due to the dominant action of the force M.

As the flow rate is increased with an associated decrease in h, the axial surface friction force $F_A$ (see FIG. 9) will correspondingly increase; hence, the transported velocity of the chip will increase. The preferred operating range, indicated by points p, q, and r in FIG. 13, is a matter of practical considerations and can vary somewhat depending on the nature of the installation. In essence, the air flow rates at p and q are approximately 0.0005 and 0.015 standard cubic feet per second, respectively. The corresponding air film thickness h at point r is approximately 0.005 and 0.007 inches where the bump height, b is typically equal to 0.003 to 0.005 inches. Thus, the clearance between the balls and conveyor surface, viz., h - b, is typically of the order of 0.002 inches.

The developed attraction force at a given flow rate is quite pronounced for a range of bump height values extending from about 0.001" to the typical values noted above. For the situation where $b=o$ and the chip surface is smooth, a residual attraction force P still exists due to the "axi-radial" flow effect. The strength of P for this situation is, however, reduced due to the smallness of the chip surface area and flow interference effects between the streams. Still, however, some motion stability exists at the low flow rate range, viz., 0.0005 to 0.0007 standard cubic feet per second. With the bumps, the increased attraction force in conjunction with the other flow characteristics, acts to provide highly stable motion to the chips while maintaining essentially non-contact conditions between them.

While there has been shown and described what is considered at present to be the preferred embodiment of the present invention, it will be appreciated by those skilled in the art that modifications of such embodiment may be made. It is therefore desired that the invention not be limited to this embodiment, and it is intended to cover in the appended claims all such modifications as fall within the true spirit and scope of the invention.

What is claimed is:

1. An air film conveyor and transporting prismatic conductor chips, the chips having a spaced distribution of a plurality of hemispheric solder mounds within an area on a surface facing said air film, said conveyor comprising:

(a) a base plate, and a pair of upstanding side guide walls extending longitudinally of said base plate, said guide walls being spaced apart a distance slightly greater than the lateral dimension of said chips;

(b) means providing a motion-controlling laminar air flow, which surrounds the chips and forms an air film supporting said chips and propelling them downstream such that the slight spacing between the chips and the guide walls causes the flow resistance to be higher in the one region defined by such slight spacing than in the region defined by the longitudinal spacing between the ends of individual chips, whereby a continuous and flexible separation action occurs between the chips;

(c) the volumetric flow rate of air per foot of conveyor being in the range of 0.0005 to 0.015 standard cubic feet per second.

2. An air film conveyor as defined in claim 1, in which said means for providing laminar air flow includes two rows of jets parallel and adjacent to the respective side walls, said rows being directed inwardly with respect to each other 3. A conveyor as defined in claim 2, in which said rows of jets are also directed forwardly with respect to the desired longitudinal movement for the chips.

4. A conveyor as defined in claim 1, in which said slight spacing between the chips and the guide walls is of the order of 0.01 inches, the logitudinal spacing between the ends of individual chips being of the order of 0.070 inches.

5. A conveyor as defined in claim 2, in which said jets are defined by ports extending through said base plate to a pressurized plenum, said ports having a length to equivalent diameter ratio greater than $0.058R_e$, where $R_e$ is the Reynolds number of the air flow through said port.

6. A conveyor as defined in claim 2, in which said rows of jets are directed inwardly such that the angle of the jets to the logitudinal axis of said guide walls is in the range of 40 to 60 degrees.

7. A conveyor as defined in claim 3, in which said rows of jets are directed forwardly by being at an angle to the vertical in the range of 40 to 60 degrees.

8. A conveyor as defined in claim 1, further comprising first vacuum pickup means for picking up the said chips from a loading station and transferring them to the upstream end of said conveyor; and second vacuum pickup means for picking up said chips at the downstream end of said conveyor and transferring them to an unloading station.

* * * * *

UNITED STATES PATENT AND TRADEMARK OFFICE
CERTIFICATE OF CORRECTION

PATENT NO. : 4,395,165
DATED : July 26, 1983
INVENTOR(S) : I. Joseph DeRobertis et al It is certified that error appears in the above-identified patent and that said Letters Patent are hereby corrected as shown below:

Column 1, line 54, "aluminum" should read --minimum--;
          line 58, "350,140" should read --3,350,140--.
Column 2, line 23, "another" should read --other--.
Column 5, line 39, "consisting" should read --constraining--;
          line 44, "FIGS. 3 - 4" should read --FIGS. 3 - 5--.
Column 6, line 56, "pump" should read --bump--.
Column 8, line 36, "of" should read --or--.
Column 9, line 42, "and" should read --for--.

Signed and Sealed this

Fourth Day of October 1983

[SEAL]

Attest:

GERALD J. MOSSINGHOFF

Attesting Officer        Commissioner of Patents and Trademarks